United States Patent [19]
Vendramin

[11] Patent Number: 5,955,789
[45] Date of Patent: *Sep. 21, 1999

[54] BALL GRID ARRAY MODULE

[75] Inventor: Giuseppe Vendramin, Carvaggio, Italy

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/947,995

[22] Filed: Oct. 9, 1997

[30] Foreign Application Priority Data

Apr. 16, 1997 [GB] United Kingdom .................. 9707679

[51] Int. Cl.$^6$ .......................... H01L 23/498; H01L 23/48
[52] U.S. Cl. ........................................... 257/786; 257/728
[58] Field of Search ................................. 257/730, 738, 257/737, 778, 728, 786

[56] References Cited

U.S. PATENT DOCUMENTS

| | | | |
|---|---|---|---|
| 5,355,283 | 10/1994 | Marrs et al. | 361/760 |
| 5,583,378 | 12/1996 | Marrs et al. | 257/730 |
| 5,717,245 | 2/1998 | Pedder | 257/698 |
| 5,796,170 | 8/1998 | Marcantonio | 257/786 |

FOREIGN PATENT DOCUMENTS

| | | | |
|---|---|---|---|
| 08064983 | 3/1996 | Japan | H05K 9/00 |
| 8-125379 | 5/1996 | Japan | H05K 9/00 |

*Primary Examiner*—Jerome Jackson, Jr.
*Assistant Examiner*—Bradley WM. Baumeister
*Attorney, Agent, or Firm*—Steven Capella

[57] ABSTRACT

A Plastic Ball Grid Array electronic package of the Cavity Down type for use in HF application. A Faraday Cage is realized to protect the active element from external HF wave interferences. The lateral sides of the Faraday Cage are constituted by a row of solder balls connected in a zig-zag way to plated through holes along the four edges of the substrate. The top side of the Cage is the metal stiffener of the Cavity Down package electrically connected to the through holes, while the bottom side is represented by the ground plane of the main board properly connected to the solder balls.

14 Claims, 3 Drawing Sheets

BALL GRID ARRAY MODULE

BACKGROUND OF THE INVENTION

The present invention relates to laminate substrates and more particularly to laminate substrates for use in the manufacturing of Ball Grid Array (BGA) electronic modules.

A recent development of technology has introduced the use of Printed Circuit Board (PCB) laminates as substrates for the manufacturing of electronic modules which can be of the Single Chip Module (SCM) type or Multi Chip Module (MCM) type. These modules are provided with a plurality of conductive pads for electrical connection with electronic circuits (such as mother boards, back planes, application boards). The electrical connection is achieved by little spherical portions of solder alloy which give the name of Ball Grid Array (BGA) to this kind of electronic module. Usually such modules use PCB laminates made of organic material. These modules are usually called Plastic Ball Grid Arrays. The definition "Plastic" indicates the organic nature of the PCB as opposed to a ceramic substrate. Another example of a BGA module is the Tape BGA (TBGA) which uses a tape of organic material as substrate instead of the laminate.

FIG. 1 is an example of a section of a BGA module of the SCM type. On the lower face of the laminate 101 there is a plurality of conductive pads 103, each pad provided with a solder ball 105 which will be put in contact with an electronic circuit and reflowed, thereby realizing the electrical connection. On the upper face of the module there is the active element 107 covered by a resin cap 109 which protects the active element. In the manufacturing of electronic modules it is common to provide the substrates with plated via holes to electrically interconnect the different conductive layers of the substrate. The substrate can be of the NIP (No Internal Plane) type, having only two conductive layers positioned on the external faces of the substrate, or can be a multi-layer substrate, having also one or more intermediate conductive layers.

An alternative PBGA module is constituted by the Cavity Down package as shown in FIG. 2. The main difference of the Cavity Down module (as opposed to the Chip-Up module described above with reference to FIG. 1) is that the active element 207 is attached on the lower side of the module, on the same side of the solder balls 205 (with conductive pads 203) and it is positioned in a sort of cavity of the organic substrate 201, which completely surrounds the active element 207. This arrangement presents some advantages with respect to the Chip-Up PBGA module. One of the advantages is the reduced thickness of the resulting package, since the chip is "contained" in the substrate. Furthermore, these modules provide a better heat dissipation, because the active element is usually attached to a metal stiffener which constitutes the top face of the module and also acts as heat dissipator.

The BGA technology has a number of advantages over traditional technologies such as the Pin Grid Arrays in terms, for example, of reliability, robustness and cost of manufacturing. Within the BGA technology the Plastic BGA represent a much cheaper solution than using other substrates, like the ceramic ones. However the state of the art Plastic BGA modules are not suitable for every kind of application.

An example is the use of PBGA in high-frequency applications. This kind of device requires Electro Magnetic Interference (EMI) shielding to avoid background interference with the product working frequency. The higher the frequency is, the shorter the related wave length. If the wave length is short enough, it can pass through the atomic structures between molecule and molecule and the signal can cross the materials commonly used for the manufacturing of the electronic packages. If this happens, the interferences/disturbances can reach the active circuit on the chip, couple with correct working signals, latching or delatching circuits in a completely arbitrary way, causing the chip functions to be unrecognisable or unusable and, in some cases, even physically damaging the application. In a normal environment, there are several possibilities for random signals with HF/Radio Frequency characteristics, such as electrical spikes, household disturbances, short wave rays (X-Rays) present in the atmosphere and many others. To avoid this major problem, it is necessary to protect the RF application with a kind of box made with a material having a very tight molecular structure, such as a metal, that cannot be crossed by the RF interferences but which reflects them back. This metal box operates as a Faraday cage that protects the application functionality.

It is known to manufacture devices for HF applications using an all metal cavity package to house the electronic circuit. In hybrid microelectronic circuits the substrate (usually ceramic) bearing silicon dice and passives is glued or brazed to bottom of metal package. Then wire bonding interconnections are formed between substrate and package leads. Then the whole module is capped by brazing or welding a cover lid to the open cavity in order to get a one piece all metal package. The EMI shielding is thus obtained by grounding the metal envelope through internal interconnections.

However, this solution involves considerably high costs. Use of low cost organic packages would be very desirable, but the state of the art PBGA do not meet the requirement of EMI Shielding.

SUMMARY OF THE INVENTION

The present invention has the object to provide a technique which alleviates the above drawbacks.

According to the present invention, we provide a laminate substrate for use in the manufacturing of Ball Grid Array electronic modules, the substrate being connectable with an active element and having on a first face a first plurality of conductive pads for receiving a first plurality of substantially spherical portions of solder alloy for input/output connection with the active element, the substrate further comprising:

a second plurality of conductive pads for receiving a second plurality of substantially spherical portions of solder alloy placed on said first face of the substrate along the perimeter of the laminate;

a plurality of plated through holes in the substrate, the plurality of through holes being substantially in close proximity to said second plurality of conductive pads; said second plurality of conductive pads being electrically connected to said plurality of through holes.

Further, according to the present invention, we provide a Plastic Ball Grid Array module comprising: an active element; an organic laminate substrate, the substrate having on a first face a first plurality of conductive pads for receiving a first plurality of substantially spherical portions of solder alloy for input/output connection with the active element, the substrate further comprising:

a second plurality of conductive pads for receiving a second plurality of substantially spherical portions of solder alloy placed on said first face of the substrate along the perimeter of the laminate;

a plurality of plated through holes in the substrate, the plurality of through holes being substantially in close proximity to said second plurality of conductive pads; said second plurality of conductive pads being electrically connected to said plurality of through holes.

Also, according to the present invention, we provide a method of manufacturing a Cavity Down BGA package using an organic laminate substrate, the method comprising the steps of:

providing the organic laminate along the perimeter with a plurality of conductive pads;

providing the organic laminate in close proximity of the plurality of conductive pads with a plurality of plated through holes;

electrically connecting the plurality of conductive pads with the plurality of through holes in order to realize a metallic fence.

Thus the present invention allows the use of low cost, commonly available, base organic material to manufacture HF devices. The present invention provides an effective shielding from Electro Magnetic Interference (EMI) by building a complete Faraday Cage, protecting the active device from atmospheric natural electromagnetic radiations of radio frequency, or the resulting disturbances in radio equipment interference.

BRIEF DESCRIPTION OF THE DRAWINGS

The above and other advantages of the present invention will be better understood with reference to the following figures, where.

DETAILED DESCRIPTION OF THE INVENTION

Figure 1:
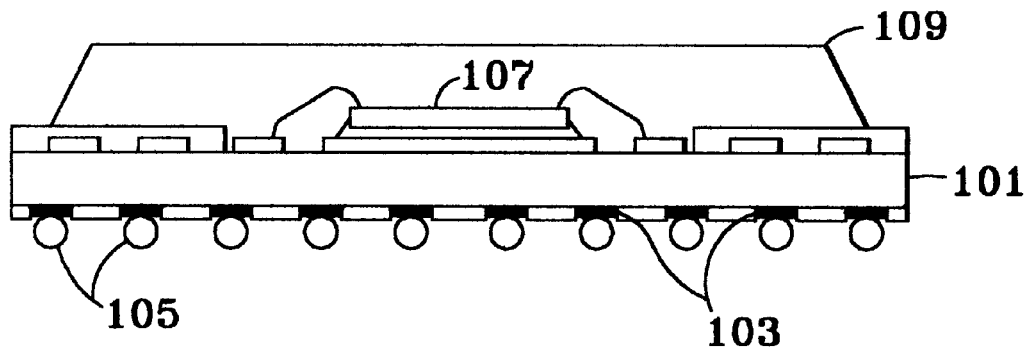
FIG. 1 is a schematic representation of a prior art BGA module of the Chip-Up type.
Figure 2:
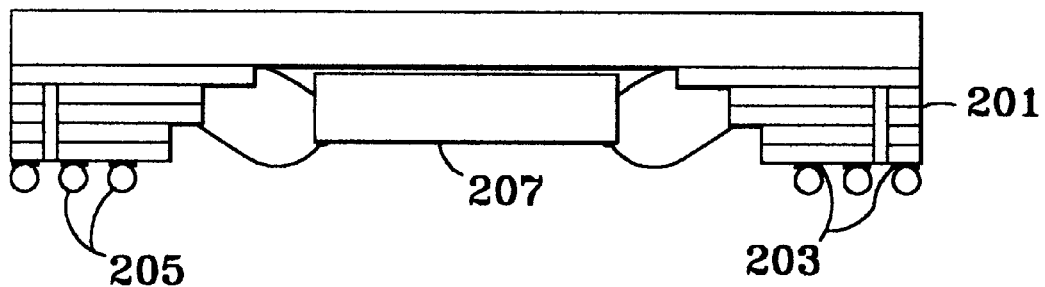
FIG. 2 is a schematic representation of a prior art BGA module of the Cavity Down type.

According to a preferred embodiment of the present invention, a Cavity Down type BGA module with organic substrate is used, like the one shown in FIG. 2, but the invention could be also carried out with different kinds of module (e.g. BGA of the Chip-Up type).

As mentioned above a full Electro Magnetic Interference (EMI) shielding of the active element of the electronic module is required, in order to use the module in High Frequency applications, otherwise external short wave interference could pass through the materials and reach the active circuit on the chip and alter the functions or damage the active element. For this reason the materials usually employed for the HF applications have a very tight molecular structure. In a typical package for HF applications the active silicon element, attached to a ceramic substrate is protected by a metal cover. The ceramic itself is a material which does not let the HF wave pass through.

Figure 3:
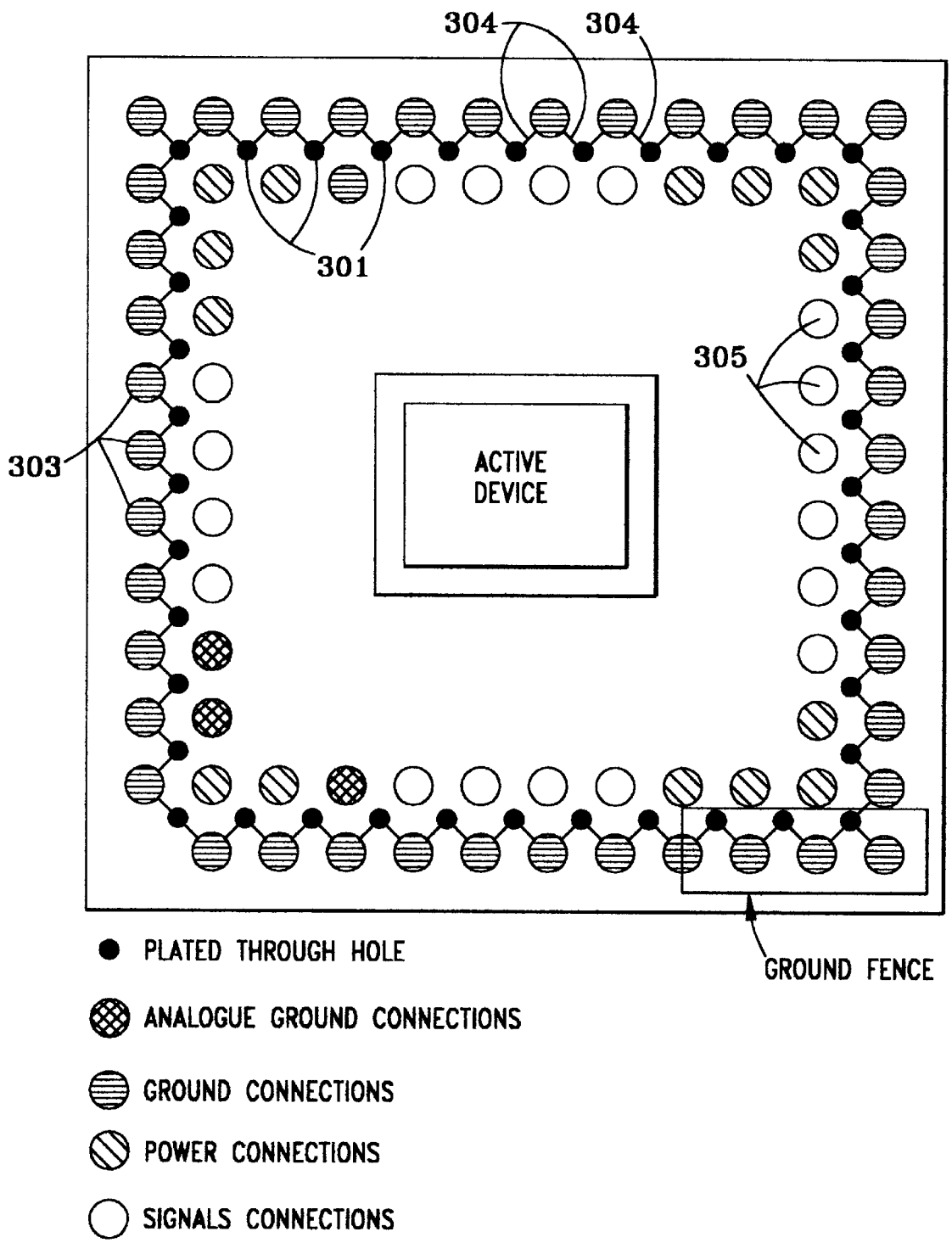
FIG. 3 is a plane view of the organic Printed Circuit Board according to a preferred embodiment of the present invention.
Figure 4A:
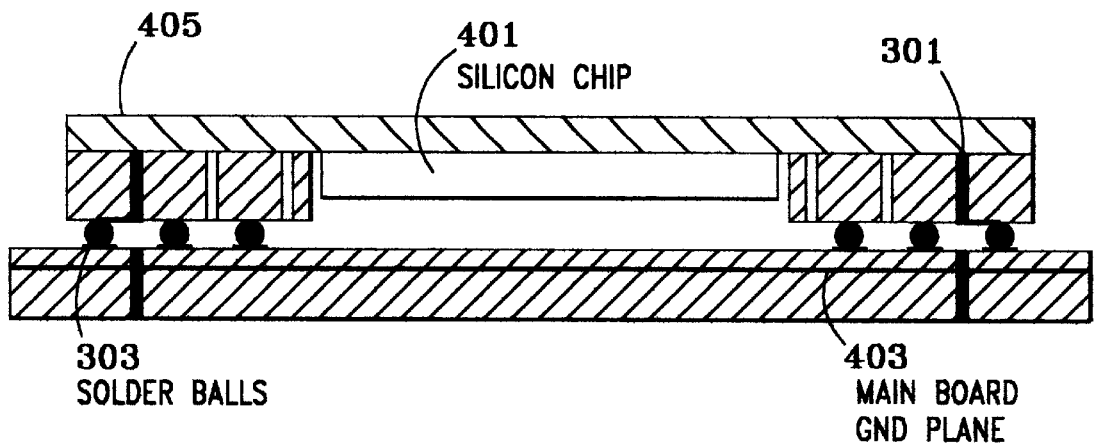
FIG. 4 is a cross section of a preferred embodiment of the present invention.
Figure 4B:
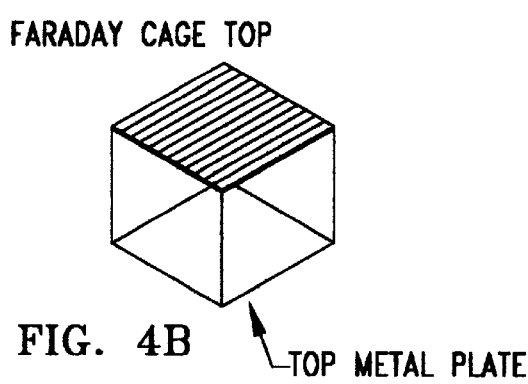
Figure 4C:
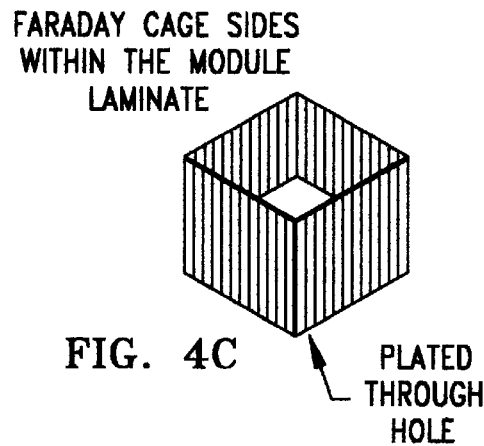
Figure 4D:
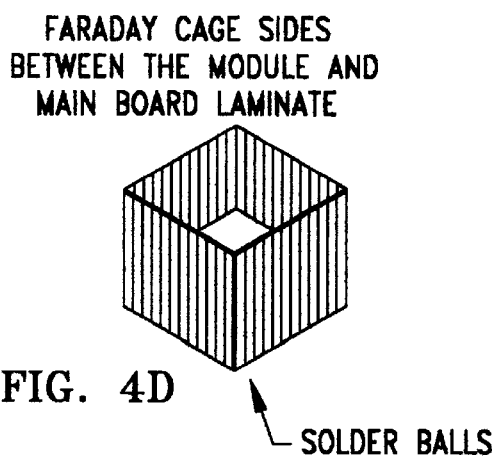
Figure 4E:
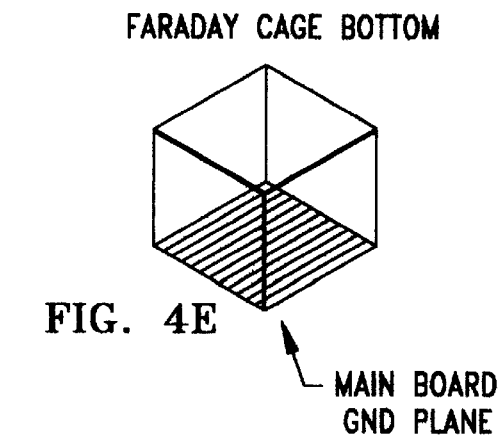

According to a preferred embodiment of the present invention a complete shielding of a module using an organic substrate is realized. The organic materials do not constitute a barrier for the HF wave. For this reason a metal fence is created along the sides of the substrate by a combination of solder balls and plated through holes connected together (for example) in a zig-zag way. As schematically shown in the plan view of FIG. 3 plated through holes 301 along the four sides of the organic substrate alternate with solder balls 302 and are connected each other and constitute a "Fence" which surrounds the whole module. This fence constitutes a shield which has been proven to be very effective for protecting against high frequency electromagnetic waves. Laboratory tests showed that a shielding like the one described above can be used to protect from a HF radiation of more than 1 GHZ. In a preferred embodiment, these through holes and solder balls are identical to the usual through holes and solder balls used for the manufacture of BGA modules, but have no connection with the active circuits. They are connected to ground for realizing the HF shielding. FIG. 3 schematically shows for example some of the solder balls 305 which realize the signal connections between the active device and the main board to which the module will be mounted.

As mentioned above, in a preferred embodiment of the present invention the substrate is organic and of the Cavity Down type. This means that the active element is contained in the substrate and the "metal fencing" of the through holes and solder balls is a complete lateral shielding. In case of a Chip-Up type the above described fencing would provide a shielding for the substrate, but additional lateral shielding would be needed to complete the protection of the active element.

Referring now to FIG. 4 the complete Faraday Cage realized with a preferred embodiment of the present invention is detailed. The active element 401 must be completely surrounded by the Faraday Cage in order to be shielded from the HF electromagnetic waves. The lateral sides of the Cage are constituted as explained above by the plated through holes 301, and by the solder balls 302 connected together. The through holes 301 provide a shielding within the substrate (which is according to the preferred embodiment an organic laminate), while the solder balls ensure a lateral protection between the substrate and the main board (when the module is finally mounted on the board). The ground plane 403 in the main board, properly connected to the solder balls 303, will constitute the lower side of the Faraday Cage, while the upper side, according to the preferred embodiment, will be realized by connecting the top metal plate 405, which usually constitutes the top side of a Cavity Down module, with the through holes 301.

As mentioned above, the through holes and the solder balls which constitutes the Faraday Cage can be identical to the active ones. According to a preferred embodiment the distance between these additional solder balls is the same as the distance fixed by the JEDEC (Joint Electron Device Engineering Council) as an industry standard for the manufacturing of BGAG modules, which is 1.27 mm, but of course other measures could be used.

I claim:

1. A laminate substrate for use in the manufacturing of Ball Grid Array electronic modules, the substrate being electrically connectable with an active element and having on a first face a first plurality of conductive pads for receiving a first plurality of portions of solder alloy for input/output electrical connection with the active element, the substrate further comprising:

a second plurality of conductive pads for receiving a second plurality of portions of solder alloy placed on said first face of the substrate along its entire perimeter, exterior to said first plurality of conductive pads;

a plurality of through holes in the substrate, the plurality of through holes being filled with electrically conductive material and being along said entire perimeter exterior to said first plurality of conductive pads;

said second plurality of conductive pads being electrically connected on said first face to said plurality of through holes, said electrical connection between said second plurality of conductive pads and said plurality of through holes being continuous about said perimeter on said first face whereby said second plurality of conductive pads and said plurality of through holes collectively act as a lateral shield against electromagnetic interference.

2. The laminate substrate of claim 1 wherein said plurality of through holes and said second plurality of conductive pads are connected in a zig-zag way alternating a through hole with a conductive pad.

3. The laminate substrate of claim 1 wherein said through holes filled with electrically conductive material are plated through holes.

4. The laminate substrate of claim 1 wherein laminate substrate is made of an organic material.

5. A Ball Grid Array (BGA) module adapted to contain one or more discrete active elements, said module comprising:

(a) a first plurality of portions of solder alloy for input/output electrical connection with said active element(s);

(b) a laminate substrate, the substrate being electrically connectable with said active element(s) and having (i) on a first face a first plurality of conductive pads for receiving said first plurality of portions of solder alloy for input/output electrical connection with said active element(s), (ii) a second plurality of conductive pads for receiving a second plurality of portions of solder alloy placed on said first face of the substrate along its entire perimeter exterior to said first plurality of conductive pads;

(iii) a plurality of through holes in the substrate, the plurality of through holes being filled with electrically conductive material and being along said entire perimeter exterior to said first plurality of conductive pads, said second plurality of conductive pads being electrically connected on said first face to said plurality of through holes, said electrical connection between said second plurality of conductive pads and said plurality of through holes being continuous about said perimeter on said first face whereby said second plurality of conductive pads and said plurality of through holes collectively act as a lateral shield against electromagnetic interference; and (c) a second plurality of portions of solder alloy placed on said first face of the substrate along its perimeter, said second plurality of portions being electrically connected to said second plurality of conductive pads and said plurality of through holes.

6. The BGA module of claim 5 wherein the substrate is an organic Printed Circuit Board (PCB).

7. The BGA module of claim 6 of the Cavity Down type.

8. The Cavity Down BCA module of claim 7 further comprising a top metal plate attached on the face of the PCB opposite to said first face, the top metal plate being electrically connected to said plurality of through holes.

9. The Cavity Down BGA module of claim 8 wherein said metal plate, said through hole, said second plurality of conductive pads and said second plurality of solder portions collectively act as a shield against electromagnetic interference external to said active element(s), said interference comprising electromagnetic radiation of a frequency greater than 1 GHz.

10. The BGA module of claim 5 wherein said through holes filled with electrically conductive material are plated through holes.

11. The module of claim 5 wherein said first and second plurality of solder portions are substantially spherical.

12. The BGA module of claim 5 wherein said laminate substrate is made of an organic material.

13. A system comprising a main board and a Cavity Down BGA module mounted on said board, the module being adapted to contain one or more discrete active elements, said Cavity Down BGA module comprising (a) a first plurality of portions of solder alloy for input/output electrical connection with said active element(s);

(b) a laminate substrate, the substrate being electrically connectable with said active element(s) and having (i) on a first face a first plurality of conductive pads for receiving said first plurality of portions of solder alloy for input/output electrical connection with said active element(s), (ii) a second plurality of conductive pads for receiving a second plurality of portions of solder alloy placed on said first face of the substrate along its entire perimeter exterior to said first plurality of conductive pads;

(iii) a plurality of through holes in the substrate, the plurality of through holes being filled with electrically conductive material and being along said entire perimeter exterior to said first plurality of conductive pads, said second plurality of conductive pads being electrically connected on said first face to said plurality of through holes, said electrical connection between said second plurality of conductive pads and said plurality of through holes being continuous about said perimeter on said first face whereby said second plurality of conductive pads and said plurality of through holes collectively act as a lateral shield against electromagnetic interference;

(c) a second plurality of portions of solder alloy placed on said first face of the substrate along its perimeter, said second plurality of portions being electrically connected to said second plurality of conductive pads and said plurality of through holes, and (d) a top metal plate attached to the face of the substrate opposite to said first face, the top metal plate being electrically connected to said through holes, and said board comprising a conductive ground plane being connectable through said second plurality of portions of solder alloy to said second plurality of conductive pads upon which connection a complete Faraday Cage about said active element(s) would be formed.

14. The system of claim 13 wherein said Faraday Cage protects said active element(s) from high frequency radiation of more than 1 GHz.

* * * * *